US012301232B2

United States Patent
Gort et al.

(10) Patent No.: US 12,301,232 B2
(45) Date of Patent: *May 13, 2025

(54) FPGA INTER-TILE CONTROL SIGNAL SHARING

(71) Applicant: EFINIX, INC., Santa Clara, CA (US)

(72) Inventors: Marcel Gort, Toronto (CA); Brett Grady, Toronto (CA)

(73) Assignee: EFINIX, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/370,356

(22) Filed: Sep. 19, 2023

(65) Prior Publication Data

US 2024/0007109 A1    Jan. 4, 2024

Related U.S. Application Data

(63) Continuation of application No. 17/651,175, filed on Feb. 15, 2022, now Pat. No. 11,791,823.

(60) Provisional application No. 63/152,125, filed on Feb. 22, 2021.

(51) Int. Cl.
*H03K 19/17728* (2020.01)

(52) U.S. Cl.
CPC ............... *H03K 19/17728* (2013.01)

(58) Field of Classification Search
CPC ......... H03K 19/17728; H03K 19/1737; H03K 19/17744; G05B 19/0423; G05B 2219/24215; G06F 30/394; G06F 30/3947; G06F 30/34

See application file for complete search history.

(56) References Cited

U.S. PATENT DOCUMENTS

| | | | |
|---|---|---|---|
| 6,046,603 A | 4/2000 | New | |
| 6,097,212 A | 8/2000 | Agrawal et al. | |
| 6,505,337 B1 | 1/2003 | Wittig et al. | |
| 7,193,436 B2 | 3/2007 | Wang et al. | |
| 9,543,958 B1 | 1/2017 | Wang | |
| 10,778,228 B1 | 9/2020 | Ossman | |
| 11,288,220 B2 | 3/2022 | Pugh et al. | |
| 11,791,823 B2 * | 10/2023 | Gort | H03K 19/17728 326/39 |
| 2006/0114024 A1 * | 6/2006 | Feng | H03K 19/17744 326/41 |
| 2007/0165457 A1 | 7/2007 | Kim | |
| 2008/0238477 A1 * | 10/2008 | Feng | G06F 30/3947 326/41 |
| 2018/0269880 A1 | 9/2018 | Rouge et al. | |

(Continued)

FOREIGN PATENT DOCUMENTS

| | | |
|---|---|---|
| CN | 101410814 A | 4/2009 |
| CN | 107925410 A | 4/2018 |

OTHER PUBLICATIONS

Office Action received in related Chinese Application No. 202210163905.5, mailed Mar. 29, 2025, 14 pages.

*Primary Examiner* — Monica C King
(74) *Attorney, Agent, or Firm* — Womble Bond Dickinson (US) LLP

(57) ABSTRACT

Methods and apparatuses to provide FPGA inter-tile control signal sharing are described. In one embodiment, the FPGA inter-tile muxing for control signals is added in a separate tile. In another embodiment, the control signal muxing is distributed among FPGA tiles and shared using a cascaded configuration.

18 Claims, 5 Drawing Sheets

(56) References Cited

U.S. PATENT DOCUMENTS

| | | | |
|---|---|---|---|
| 2021/0013886 A1* | 1/2021 | Vrudhula | H03K 19/17744 |
| 2023/0216503 A1* | 7/2023 | Singh | H03K 19/17728 326/38 |

* cited by examiner

FPGA INTER-TILE CONTROL SIGNAL SHARING

CROSS-REFERENCE TO RELATED APPLICATIONS

This application is a continuation of U.S. patent application Ser. No. 17/651,175, filed Feb. 15, 2022, entitled "FPGA INTER-TILE CONTROL SIGNAL SHARING", which claims the benefit of U.S. provisional patent application No. 63/152,125, entitled "FPGA INTER-TILE CONTROL SIGNAL SHARING" filed on Feb. 22, 2021, both of which are incorporated herein by reference in their entirety.

FIELD

Embodiments as described herein relate to a field of programmable gate architectures, and in particular, to programmable gate architectures with inter-tile control signal sharing.

BACKGROUND

Generally, Field Programmable Gate Arrays (FPGAs) are built using repeated tiles, each of which contains one or more Lookup Tables (LUTs) and one or more flip flops (FFs). Each tile has input multiplexing (muxing) driven by certain wires that pass through that tile. Typically, signals are categorized into two types: data signals that drive the inputs of LUTs or the data inputs of FFs, and control signals that drive the other inputs of FFs (e.g., clock-enable and preset/reset signals).

Each tile has muxing dedicated to routing data signals from general purpose routing wires and muxing dedicated to routing control signals from general purpose routing wires, as well as "global" routing wires specifically created to route clock and control signals. Typically, these global routing wires are implemented using less resistive metal, which means they are in limited supply.

It is common for many FFs in a design implemented on an FPGA to have similar control signals. For example, the same reset signal may be used for all FFs in a design. For that reason, FPGA architectures typically share control signal input muxing between all FFs in a tile. For example, there may be a total of two clock-enable signals that can drive all of the FFs in a tile, each of which would have muxing to bring signals in from local and global routing.

SUMMARY

Methods and apparatuses to provide FPGA inter-tile control signal sharing are described. Embodiments described herein include FPGAs that share control signals between tiles. In at least some embodiments, an FPGA apparatus a plurality of FPGA tiles and a control signal muxing circuitry that is shared between FPGA tiles of the plurality of FPGA tiles. In at least some embodiment, the muxing for control signals is added in a separate tile to avoid having the muxing in each of the FPGA tiles. In another embodiment, the control signal muxing circuitry is distributed among the FPGA tiles that are connected together in a cascaded configuration.

In at least some embodiments, an apparatus comprises a memory; and a processor coupled to the memory. The processor is configured to determine routing for a plurality of FPGA tiles and determine a control signal muxing circuitry shared between FPGA tiles of the plurality of FPGA tiles. In at least some embodiment, the muxing for control signals is added in a separate tile to avoid having the muxing in each of the FPGA tiles. In another embodiment, the control signal muxing circuitry is distributed among the FPGA tiles that are connected together in a cascaded configuration.

In at least some embodiments, a non-transitory machine readable medium is provided. The non-transitory machine readable medium stores instructions that cause a data processing system to perform operations comprising determining a plurality of FPGA tiles; and determining a control signal muxing circuitry that is shared between FPGA tiles of the plurality of FPGA tiles. In at least some embodiment, the muxing for control signals is added in a separate tile to avoid having the muxing in each of the FPGA tiles. In another embodiment, the control signal muxing circuitry is distributed among the FPGA tiles that are connected together in a cascaded configuration.

Other apparatuses, methods, and machine-readable mediums to provide FPGA inter-tile control signal sharing are also described.

BRIEF DESCRIPTION OF DRAWINGS

Embodiments of the application may best be understood by referring to the following description and accompanying drawings that are used to illustrate embodiments of the application. In the drawings.

DETAILED DESCRIPTION

Figure 1:
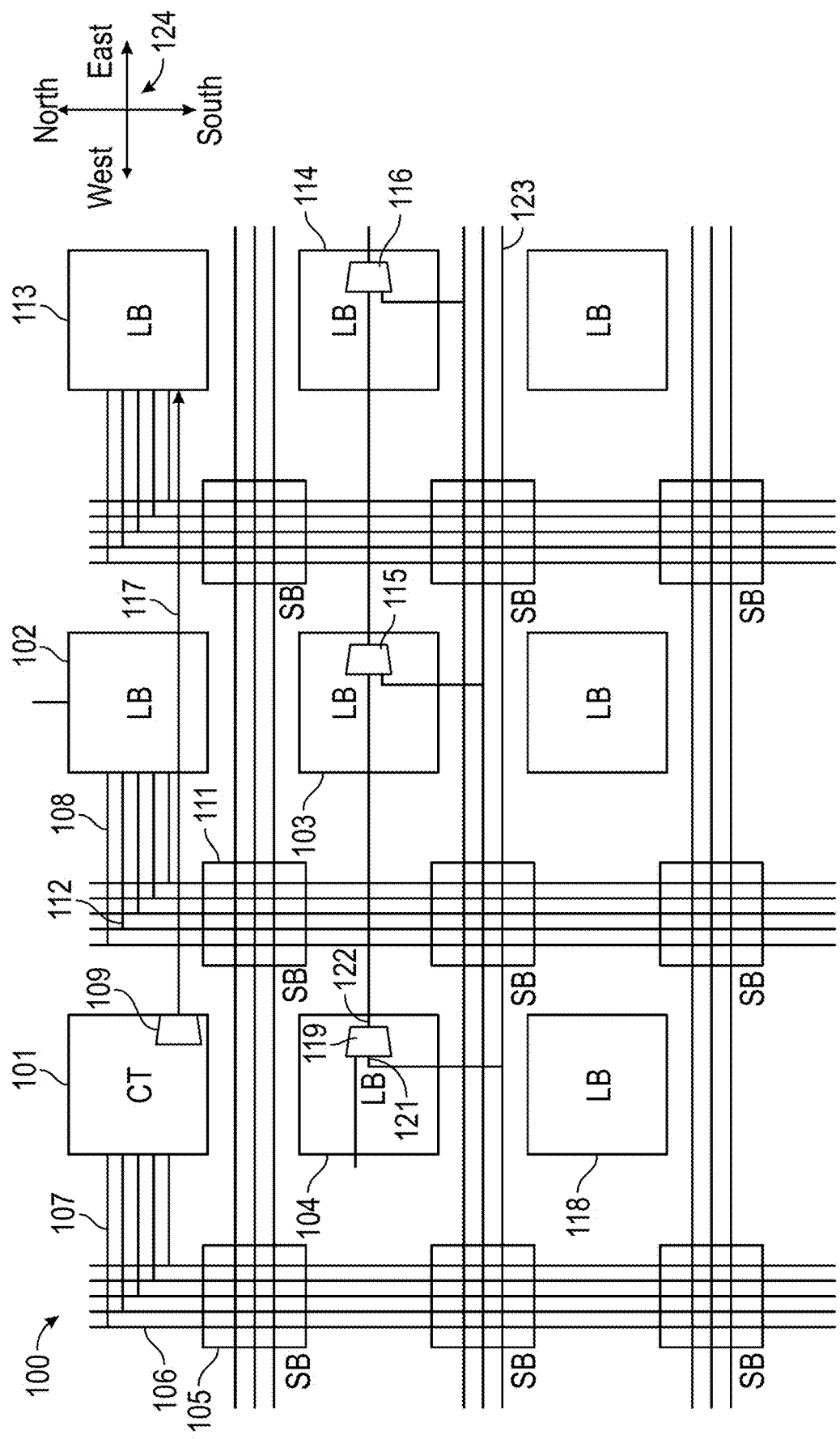
FIG. 1 is a view of a field programmable gate array (FPGA) system architecture according to one embodiment.

Methods and apparatuses to provide FPGA inter-tile control signal sharing are described. Embodiments described herein include FPGAs that share control signals between logic block tiles, so that chip area needed to provide muxing for each of the logic blocks tiles is reduced. In at least some embodiments, an FPGA apparatus comprises a plurality of FPGA tiles and a control signal muxing circuitry that is shared between FPGA tiles of the plurality of FPGA tiles. In at least some embodiment, the inter-tile muxing for control signals is added in a separate tile to avoid having the same muxing in each of the FPGA tiles. A separate control signal muxing tile that has the control signal muxing that is shared between all of the FPGA tiles in a group is provided. The separate control signal muxing tile as described herein avoids having to re-implement the same muxing in every tile, so that the cost of the muxing can be amortized across many FPGA logic block tiles. In at least some embodiment, the muxing for control signals is added in a separate tile that is dedicated to control signal muxing. In at least some embodiment, the muxing for control signals is added in a separate tile that already exists to support global signal routing.

In at least some embodiments, the routing lines run from the control signal routing tiles one or both vertically and horizontally to logic block tiles. The logic block tiles can select any of the control signal routing lines to drive the FFs contained therein. This has the effect of amortizing the area of the control signal muxing among all the logic block tiles that use the lines. For example, if there is one control signal muxing tile for every 10 logic block tiles, the control signal muxing area per tile is divided among 10 tiles. This provides a benefit of one or both of increasing the flexibility of the control signal muxing and decreasing the area dedicated to control signal muxing, comparing to conventional techniques.

In another embodiment, the control signal muxing is distributed among different FPGA tiles and then shared using a cascaded configuration. In this case, to achieve the FPGA inter-tile control signal sharing, each logic block tile of a group of FPGA logic tiles has a small control signal sharing multiplexor (mux) with a reduced, or minimal, number of inputs to mux a control signal for sharing. In at least some embodiments, determining whether control signals are routed via the cascade path or directly via the mux at the same location that the control signal is consumed is based on one or more design constraints. In at least some embodiments, the design constraint is a timing constraint (e.g., a delay from a driver through routing to a control signal sink is not more than 1 nanosecond (ns), or other predetermined delay). In at least some embodiments, the design constraint is a power constraint, so that the cascade is used as much as possible to reduce wire loading, thereby reducing power. In one embodiment, the number of inputs of the mux for shared control signal muxing is determined based on a design constraint. In one embodiment, the number of inputs of the mux for the distributed control signal muxing is two for a uni-directional cascaded configuration. In one embodiment, the number of inputs of the mux for the distributed control signal muxing is three for a bidirectional cascaded configuration, as described in further detail below with respect to FIGS. 3 and 4. The control signal sharing muxes of the logic block tiles are connected in a cascaded configuration, so that a group of the logic block tiles with a same control signal requirement has far more routing flexibility comparing to conventional techniques.

The FPGA inter-tile control signal sharing as described herein is particularly effective for FPGA architectures with low numbers of LUTs and FFs per tile, for example, fewer than about 8 LUTs and 16 FFs/per tile. These architectures typically suffer from inefficient control signal muxing relative to FPGA architectures with a higher number of LUTs and FFs per tile. With the FPGA inter-tile control signal sharing as described herein, the cost of the control signal muxing is independent of the number of LUTs/FFs per tile.

Various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

FIG. 1 is a view 100 of a field programmable gate array (FPGA) system architecture according to one embodiment. The FPGA system includes a plurality of FPGA tiles, such as, for example, FPGA tiles 101, 102, 103, 104, 105, 111, 113, 114 and 118 arranged in rows and columns. The tiles are connected using wires. As shown in FIG. 1, a tile 101 is connected to wires of a routing track 106 by wires 107. The wires of the routing track 106 pass through a tile 105. A tile 102 is connected to wires of a routing track 112 by wires 108. The wires of the routing track pass through a tile 111. As shown in FIG. 1, some of the FPGA tiles, such as, for example, tiles 102, 103, 104, 113 and 114 are logic blocks (LBs). Some of the FPGA tiles, such as, for example, a tile 105 and a tile 111 are switch blocks (SBs). Control signal muxing is shared between FPGA tiles of the plurality of FPGA tiles. Generally, a control signal refers to a signal that is other than a data signal, such as, for example, a clock-enable signal, a preset/reset signal, a synchronous load signal, a synchronous clear signal, or other control signal. The control signal may be shared by many flip flops on an FPGA tile.

In at least some embodiments, the control signal muxing is in a separate control signal (CT) tile, e.g., a CT tile 101. The CT tile 101 is configured to share the control signal muxing between some of the FPGA tiles, for example, between a tile 102 and a tile 113, to avoid having the same muxing in each of these FPGA tiles. In at least some embodiments, the CT tile 101 is not a logic block tile. In at least some embodiments, the CT tile 101 does not have any logic associated with it. In at least some embodiments, the CT tile 101 does not have FFs and LUTs associated with the logic block tile. The CT tile 101 is a control signal muxing tile that is configured to take one or more control signals from a routing network, such as, for example, a global routing network or a local routing network. Typically, for FPGA architecture the term "cascade" refers to passing a signal from one tile to another tile in succession (series). CT tile 101 is configured to pass those control signals to a dedicated wire connected to other tiles associated with that control signal block. As shown in FIG. 1, a routing line 117 extends from CT tile 101 to carry a control signal that is shared between the FPGA tiles, e.g., a LB tile 102 and a LB tile 111. In at least some embodiments, the size of the CT tile is smaller than the size of the LB tile. In at least some embodiments, the FPGA system includes a plurality of CT tiles, such as CT tile 101 to share the control signals to groups of LB tiles.

In at least some embodiments, CT tile 101 includes one or more control signal sharing multiplexors, such as a control signal sharing multiplexor 109. As shown in FIG. 1, routing line 117 is driven from an output of the multiplexor 109 to a group of the FPGA tiles, e.g., LB tile 102 and LB tile 111. In at least some embodiments, each of the control signal sharing multiplexors outputs a control signal on a respective routing line to share between a group of the FPGA tiles. In at least some embodiments, the control signal routing lines can extend horizontally towards a group of the FPGA tiles that are arranged in a row such as, for example, LB tile 102 and LB tile 111. In at least some embodiments, the control signal routing lines can extend vertically towards a group of the FPGA tiles that are arranged in a column such as, for example, LB tile 104 and LB tile 118. In at least some embodiments, the FPGA tiles share the control signal muxing in series. As shown in FIG. 1, the control signal routing line 117 is cascaded through the LB tile 102 to reach tile 113.

In another embodiment, the control signal muxing is distributed among different FPGA tiles, such as, for example, tiles 104, 103 and 114 that are connected together in a cascaded configuration. As shown in FIG. 1, each of the FPGA tiles 104, 103 and 114 has a control signal multiplexor, such as a multiplexor 119, a multiplexor 115 and a multiplexor 116. The multiplexors 119, 115 and 116 are connected to each other in a cascaded configuration to share the control signal muxing. As shown in FIG. 1, multiplexor 115 is in a neighboring tile to the tile 104. Generally, a tile A is said to be a neighboring tile to a tile B if it is physically adjacent to tile B. A horizontal neighbor tile A is one in which tile A is either directly east or west of tile B with no other tiles between tile A and B. A diagonal tile A is one in which tile A is either directly north-east, north-west, south-east, or south-west of tile B, with no other tiles between A and B. A vertical neighbor tile A is one in which tile A is either directly north or south of tile B with no other tiles between tile A and B. A diagram 124 represents north, south, east and west directions on an FPGA architecture map. As shown in FIG. 1, tile 102 is directly east of tile 101, tile 103 is directly south-east of tile 101, and tile 104 is directly south of tile 101.

As shown in FIG. 1, an input 121 of the multiplexor 119 is connected to a control signal line 123, an output 122 of the multiplexor 119 that carries the control signal is connected to an input of the multiplexor 115, an output of the multiplexor 115 is connected to an input of multiplexor 116, so that the control signal is shared between the tiles 104, 103 and 114. In one embodiment, each of the multiplexors 119, 115 and 116 has three inputs for a bidirectional cascaded configuration, as described in further detail below with respect to FIG. 3. In one embodiment, each of the multiplexors 119, 115 and 116 has two inputs for a uni-directional cascaded configuration, as described in further detail below with respect to FIG. 4.

Figure 2:
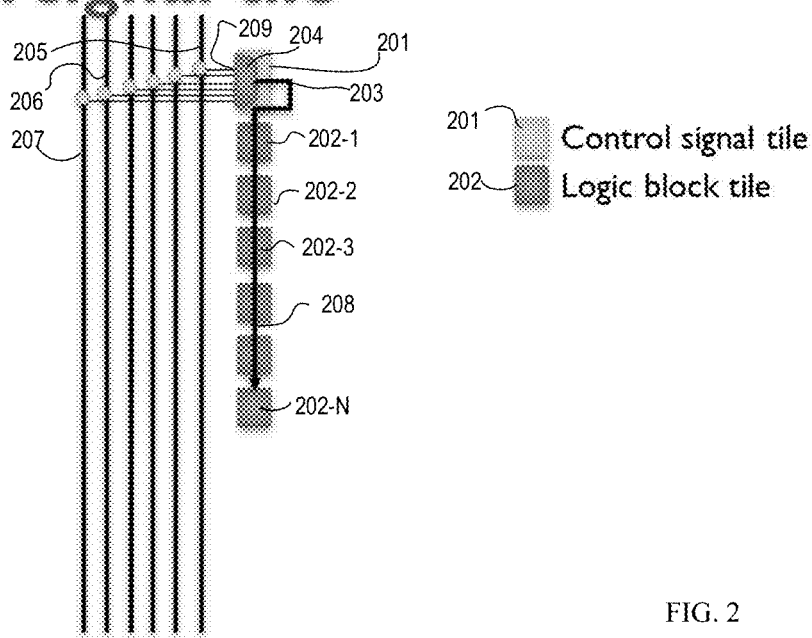
FIG. 2 is a view of the FPGA system architecture that includes a separate control signal muxing tile that is configured to share control signals between LB tiles 202 according to one embodiment.

FIG. 2 is a view 200 of the FPGA system architecture that includes a separate control signal muxing tile 201 that is configured to share control signals between LB tiles 202 according to one embodiment. In at least some embodiments, view 200 represents a portion of the FPGA system architecture described with respect to FIG. 1. As shown in FIG. 2, control signal muxing tile 201 includes a multiplexor (mux) 204. Inputs of the multiplexor 204 are connected to the wires of a routing track 207, such as, for example, wires 205 and 206. In one embodiment, at least one of the wires of the routing track 207 is a global routing wire created to route control signals. The control signal muxing in the control signal muxing tile 201 is configured to pass a control signal on one of the inputs of mux 204 to the output 203 to distribute to an N number of the LB tiles 202-N, such as for example, logic tiles 202-1, 202-2, 202-3, where N is an integer greater than 1.

As shown in FIG. 2, an input 209 of the mux 204 is connected to wire 205 of the routing track. In one embodiment, the wire 205 of the routing track carries a control signal. As shown in FIG. 2, a routing line 208 extends from the output 203 to carry the control signal to share among the FPGA tiles 202-N. As shown in FIG. 2, routing line 208 drives the FPGA tiles 202-1, 202-1, 202-2, 202-3 until reaching the 202-N. In this way, the LB tiles 202-N benefit from increased flexibility of the mux 204 in the control signal muxing tile 201, as the control signal is passed in series to FPGA tiles 202-1, 202-1, 202-2, 202-3, ... 202-N.

Figure 3:
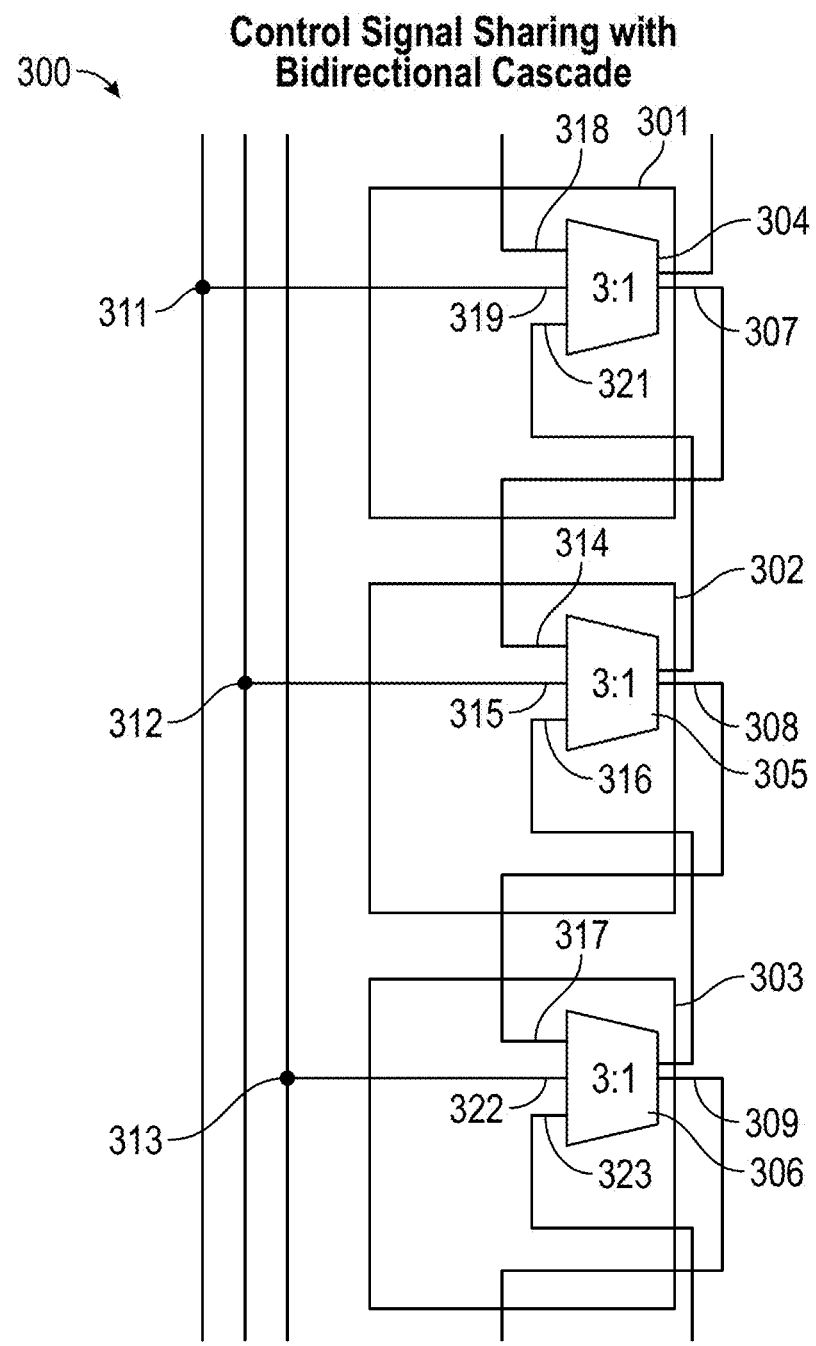
FIG. 3 is a view of the FPGA system architecture that includes a control signal muxing circuitry that is shared between FPGA tiles of the plurality of FPGA tiles according to another embodiment.

FIG. 3 is a view 300 of the FPGA system architecture that includes a control signal muxing that is shared between FPGA tiles of the plurality of FPGA tiles according to another embodiment. In this scheme, the control signal muxing is distributed among the LB tiles and connected together in a cascaded configuration. In at least some embodiments, view 300 represents a portion of the FPGA system architecture described with respect to FIG. 1. As shown in FIG. 3, the FPGA system architecture includes LB tiles, such as, for example, a LB tile 301, a LB tile 302 and a LB tile 303. In an embodiment, the FPGA tiles comprise multiplexors that are connected to each other in a cascaded configuration to share the control signal muxing. In an embodiment, the cascaded configuration to share the control signal muxing is a bidirectional cascaded configuration. As shown in FIG. 3, LB tile 301 has a control signal mux 304, LB tile 302 has a control signal mux 305 and LB tile 303 has a control signal max 306. Each of the control signal muxes 304, 305 and 306 is a 3:1 mux that has three inputs and one output. As shown in FIG. 3, an input 314 of the mux 305 is connected to an output 307 of mux 304. An input 315 of the mux 305 is connected to a routing line 312. An input 316 of the mux 305 is connected to an output 309 of the mux 306. An output 308 of mux 305 is connected to an input 321 of the mux 304 and an input 317 of the mux 306. An input 318 of the mux 304 is configured to connect to an output of the mux in a tile that is above the tile 301. An input 319 of the mux 304 is connected to a routing line 311. Output 307 of mux 304 is configured to connect to an input of the mux in the tile that is above the tile 301. An input 322 of the mux 306 is connected to a routing line 313. An input 323 of the mux 306 is configured to connect to an output of the mux that is in a tile below the tile 303. Output 309 of mux 306 is configured to connect to an input of the mux in the tile that is below the tile 303. In this arrangement, each of the logic block tiles has a small (e.g., 3:1) control signal mux that has as inputs the output of the mux in the tile below, the output of the mux in the tile above, and one or more wires of routing lines. The net effect is that for a group of logic block tiles with the same control signal requirement, as long as the control signal can be routed on any of the wires accessed by any of the muxes in the group, then that control signal can be distributed to all logic block tiles in the group. For example, a control signal routed on a wire connected to routing line 312 that is accessed by mux 305 is distributed bi-directionally from tile 302 to all LB tiles in a group that includes one or more tiles below or above tile 303, e.g., tiles 301 and 303. A control signal routed on a wire connected to routing line 311 that is accessed by mux 304 is distributed bi-directionally from tile 301 to all LB tiles in a group that includes one or more tiles below or above tile 301, tiles 302 and 303. A control signal routed on a wire connected to routing line 313 that is accessed by mux 306 is distributed bi-directionally from tile 303 to all LB tiles in a group that includes one or more tiles below or above tile 303, e.g., tiles 301 and 302.

Figure 4:
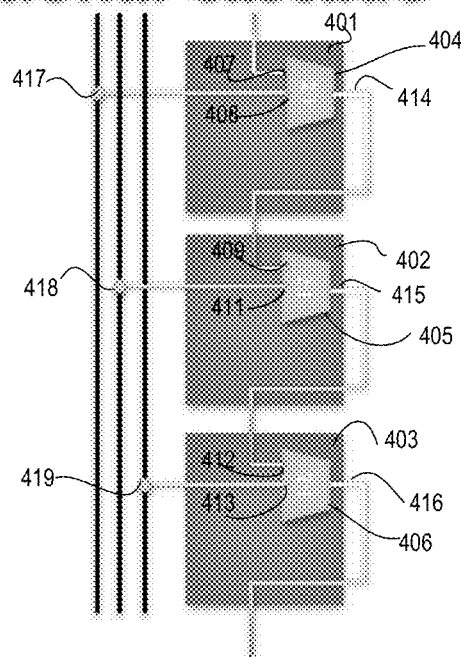
FIG. 4 is a view of the FPGA system architecture that includes a control signal muxing circuitry that is shared between FPGA tiles of the plurality of FPGA tiles according to another embodiment.

FIG. 4 is a view 400 of the FPGA system architecture that includes a control signal muxing that is shared between FPGA tiles of the plurality of FPGA tiles according to another embodiment. In this scheme, the control signal muxing is distributed among the LB tiles that are connected together in a unidirectional cascaded configuration. In at least some embodiments, view 400 represents a portion of the FPGA system architecture described with respect to FIG. 1. As shown in FIG. 4, the FPGA system architecture includes LB tiles, such as, for example, a LB tile 401, a LB tile 402 and a LB tile 403. In an embodiment, the FPGA tiles comprise multiplexors that are connected to each other in a unidirectional cascaded configuration to share the control signal muxing. As shown in FIG. 4, LB tile 401 has a control signal mux 404, LB tile 402 has a control signal mux 405 and LB tile 403 has a control signal max 406. Each of the control signal muxes 404, 405 and 406 is a 2:1 mux that has two inputs and one output. As shown in FIG. 4, an input 407 of the mux 404 is configured to connect to an output of the mux in a tile that is above the tile 401. An input 408 of the mux 404 is connected to a routing line 417. Output 414 of mux 404 is connected to an input 409 of the mux 405. An input 411 of the mux 405 is connected to a routing line 418. An output 415 of mux 405 is connected to an input 412 of the mux 406. An input 413 of the mux 406 is connected to a routing line 419. An output 416 of mux 406 is configured to connect to an input of the mux in the tile that is below the tile 403. In an embodiment, each of the logic block tiles has a 2:1 control signal mux that has as inputs the output of the mux in the tile above and a wire connected to one of the routing lines. A control signal routed on a wire connected to routing line 417 that is accessed by mux 404 is distributed uni-directionally from tile 401 to all LB tiles in a group that includes one or more tiles below tile 401, e.g., tiles 402 and 403. A control signal routed on a wire connected to routing line 418 that is accessed by mux 405 is distributed uni-directionally from tile 402 to all LB tiles in a group that includes one or more tiles below tile 402, e.g., tile 403. A control signal routed on a wire connected to routing line 419 that is accessed by mux 406 is distributed uni-directionally from tile 403 to all LB tiles in a group that includes one or more tiles below tile 403. In an embodiment, a control signal routed on a wire accessed by a mux in a LB tile is distributed to one or more other LB tiles that are next to that LB tile.

Figure 5:
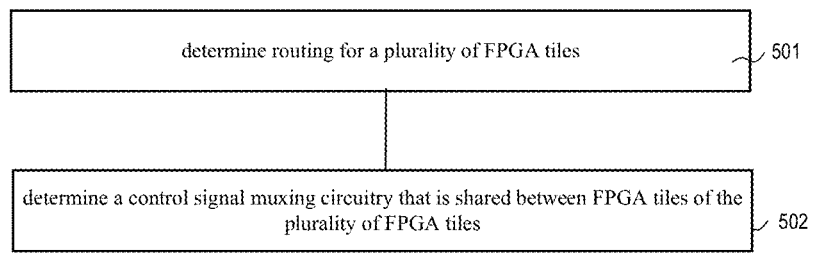
FIG. 5 is a flowchart of a method to provide FPGA inter-tile control signal sharing according to one embodiment.

FIG. 5 is a flowchart of a method 500 to provide FPGA inter-tile control signal sharing according to one embodiment. Method 500 starts at operation 501 that involves determining routing for a plurality of FPGA tiles. In at least some embodiments, the FPGA tiles comprise logic block tiles, as described above. At operation 502 a control signal muxing circuitry shared between FPGA tiles of the plurality of FPGA tiles is determined. In at least some embodiments, a separate control signal muxing tile that is configured to share the control signal muxing to avoid having the same muxing in each of the FPGA tiles is determined, as described above. In at least some embodiments, a routing line extending from the control signal muxing to carry a control signal that is shared between the FPGA tiles is determined, as described above. In at least some embodiments, the control signal muxing comprises one or more multiplexors. Each of the one or more multiplexors is to output a control signal to share between a group of the FPGA tiles, as described above. In at least some embodiments, the control signal muxing is distributed among the FPGA tiles that are connected together in a cascaded configuration, as described above. In at least some embodiments, routing for a first FPGA tile comprising a first multiplexor is determined. Routing for a second FPGA tile comprising a second multiplexor is determined. The second FPGA tile is a neighboring tile to the first FPGA tile. At least one input of the first multiplexor is connected to a control signal line and an output of the first multiplexor is connected to an input of the second multiplexor, as described above.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description herein. In addition, embodiments of the disclosure are not described with reference to any particular programming language. It will be appreciated that a variety of programming languages may be used to implement the teachings of the embodiments as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A field programmable gate array (FPGA) apparatus comprising:
   a plurality of FPGA tiles; and
   a control signal multiplexing (muxing) circuitry to input one or more control signals from a routing network and output a control signal from a routing network and output a control signal that is shared between a group of FPGA tiles including a first FPGA tile and a second FPGA tile of the plurality of FPGA tiles in series, wherein the routing line is cascaded through the first FPGA tile to reach to the second FPGA tile.

2. The apparatus of claim 1, further comprising:
   a control signal muxing tile comprising the control signal muxing circuitry that is separate from the group of FPGA tiles.

3. The apparatus of claim 1, wherein the control signal muxing circuitry comprises one or more multiplexors, wherein each of the one or more multiplexors to output the control signal shared between the group of the FPGA tiles.

4. The apparatus of claim 1, wherein the control signal muxing circuitry comprises
   a multiplexor; and
   a routing line that extends from an output of the multiplexor to the group of FPGA tiles.

5. The apparatus of claim 1, wherein the group of FPGA tiles comprise logic block tiles.

6. The apparatus of claim 1, wherein the group of FPGA tiles are arranged in at least one of a column or a row.

7. The apparatus of claim 1, wherein the control signal muxing is distributed among the group of FPGA tiles using a bidirectional cascaded configuration.

8. The apparatus of claim 1, wherein the control signal muxing is distributed among the group of FPGA tiles using a unidirectional cascaded configuration.

9. The apparatus of claim 1, wherein the group of the FPGA tiles comprise multiplexors that are connected to each other in a cascaded configuration to share the control signal muxing.

10. The apparatus of claim 1, wherein the first FPGA tile comprises a first multiplexor, the second FPGA tile comprises a second multiplexor that is a neighboring tile to the first FPGA tile, wherein at least one input of the first multiplexor is connected to a control signal line and an output of the first multiplexor is connected to an input of the second multiplexor.

11. An apparatus, comprising:
    a memory; and
    a processor coupled to the memory, wherein the processor is configured to:
    determine routing for a plurality of FPGA tiles; and
    determine a control signal multiplexing (muxing) circuitry that is configured to input one or more control signals from a routing network and output a control signal that is shared between a group of FPGA tiles including a first FPGA tile and a second FPGA tile of the plurality of FPGA tiles in series.

12. The apparatus of claim 11, wherein the processor is further configured to:
    determine a control signal muxing tile that is configured to share the control signal, the control signal muxing tile being separate from the group of FPGA tiles.

13. The apparatus of claim 11, wherein the control signal muxing circuitry comprises one or more multiplexors, wherein each of the one or more multiplexors to output the control signal shared between the group of the FPGA tiles.

14. The apparatus of claim 11, wherein the group of FPGA tiles comprise logic block tiles.

15. The apparatus of claim 11, wherein the group of FPGA tiles are arranged in at least one of a column or a row.

16. The apparatus of claim 11, wherein the control signal muxing is distributed among the FPGA tiles that are connected together in a cascaded configuration.

17. The apparatus of claim 11, wherein the first FPGA tile comprises a first multiplexor, the second FPGA tile comprises a second multiplexor that is a neighboring tile to the first FPGA tile, and connect at least one input of the first multiplexor to a control signal line and connect an output of the first multiplexor to an input of the second multiplexor.

18. A non-transitory machine readable medium storing instructions that cause a data processing system to perform operations comprising:
    determining a plurality of FPGA tiles; and
    determining a control signal multiplexing (muxing) circuitry that is configured to input one or more control signals from a routing network and output a control signal that is shared between a group of FPGA tiles including a first FPGA tile and a second FPGA tile of the plurality of FPGA tiles in series, wherein the first FPGA tile comprising a first multiplexor, the second FPGA tile comprising a second multiplexor that is a neighboring tile to the first FPGA tile, wherein at least one input of the first multiplexor is connected to a control signal line and an output of the first multiplexor is connected to an input of the second multiplexor.

* * * * *